United States Patent [19]

Hastings et al.

[11] Patent Number: 4,748,915
[45] Date of Patent: * Jun. 7, 1988

[54] INSULATING APPARATUS AND COMPOSITE LAMINATES EMPLOYED THEREIN

[76] Inventors: Otis H. Hastings; Otis M. Hastings, both of 130 E. Crescent Ave., Mahwah, N.J. 07430

[*] Notice: The portion of the term of this patent subsequent to May 5, 2004 has been disclaimed.

[21] Appl. No.: 5,328

[22] Filed: Jan. 21, 1987

Related U.S. Application Data

[60] Division of Ser. No. 788,693, Oct. 21, 1985, abandoned, which is a continuation of Ser. No. 490,570, May 2, 1983, abandoned, which is a division of Ser. No. 102,552, Dec. 11, 1979, Pat. No. 4,381,716, which is a continuation-in-part of Ser. No. 912,974, Jun. 5, 1978, abandoned.

[51] Int. Cl.⁴ .............................................. E04H 9/00
[52] U.S. Cl. ........................................ 109/2; 109/5; 109/7; 109/65; 109/82; 109/85
[58] Field of Search ........................................ 109/2-8, 109/10-13, 17, 19, 45, 48, 57, 67, 68, 73, 82, 85, 65

[56] References Cited

U.S. PATENT DOCUMENTS

| | | |
|---|---|---|
| 480,099 | 8/1892 | Hull . |
| 2,879,725 | 3/1959 | Zuver . |
| 3,484,306 | 12/1969 | Mueller . |
| 3,709,717 | 1/1973 | Hamling .............................. 428/246 |
| 3,715,265 | 2/1973 | Allen .................................. 428/472 |
| 3,736,160 | 5/1973 | Hamling . |
| 3,991,242 | 11/1976 | Tuttle .................................... 428/57 |
| 3,994,243 | 11/1976 | Anders ................................... 109/2 |
| 4,055,451 | 10/1977 | Cockbain ............................. 428/472 |
| 4,121,523 | 10/1978 | Hastings ................................ 109/2 |
| 4,194,036 | 3/1980 | Davis ................................... 428/920 |
| 4,198,454 | 4/1980 | Horton ................................. 428/911 |
| 4,381,716 | 5/1983 | Hastings ................................ 109/5 |
| 4,470,357 | 9/1984 | Sanzare ................................ 109/82 |
| 4,523,528 | 6/1985 | Hastings ............................... 109/42 |
| 4,662,288 | 5/1987 | Hastings ................................ 109/2 |

Primary Examiner—Robert L. Wolfe
Attorney, Agent, or Firm—Peter L. Berger

[57] ABSTRACT

Transaction processing enclosures for containment of electronic data processing equipment, banking apparatus and the like incorporating a housing comprising a composite laminate composed of reflective, refractory and structural elements to provide an enclosure of unique structural integrity, and protection to the environment within and outside said enclosure against adverse factors such as impact and fire, and insulation against wide variations in temperature exterior to said enclosure while sustaining a stable environment within said enclosure.

1 Claim, 3 Drawing Sheets

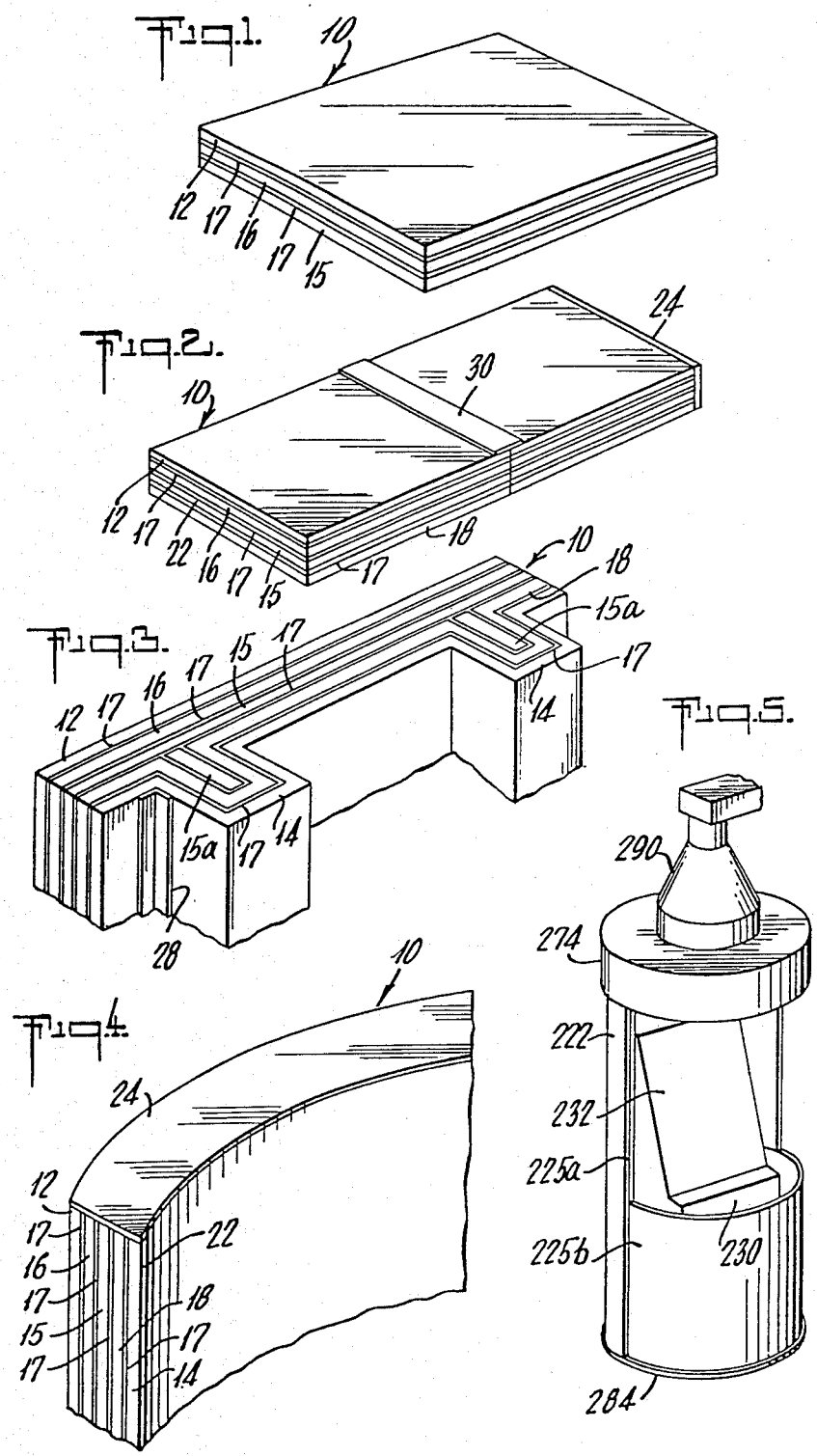

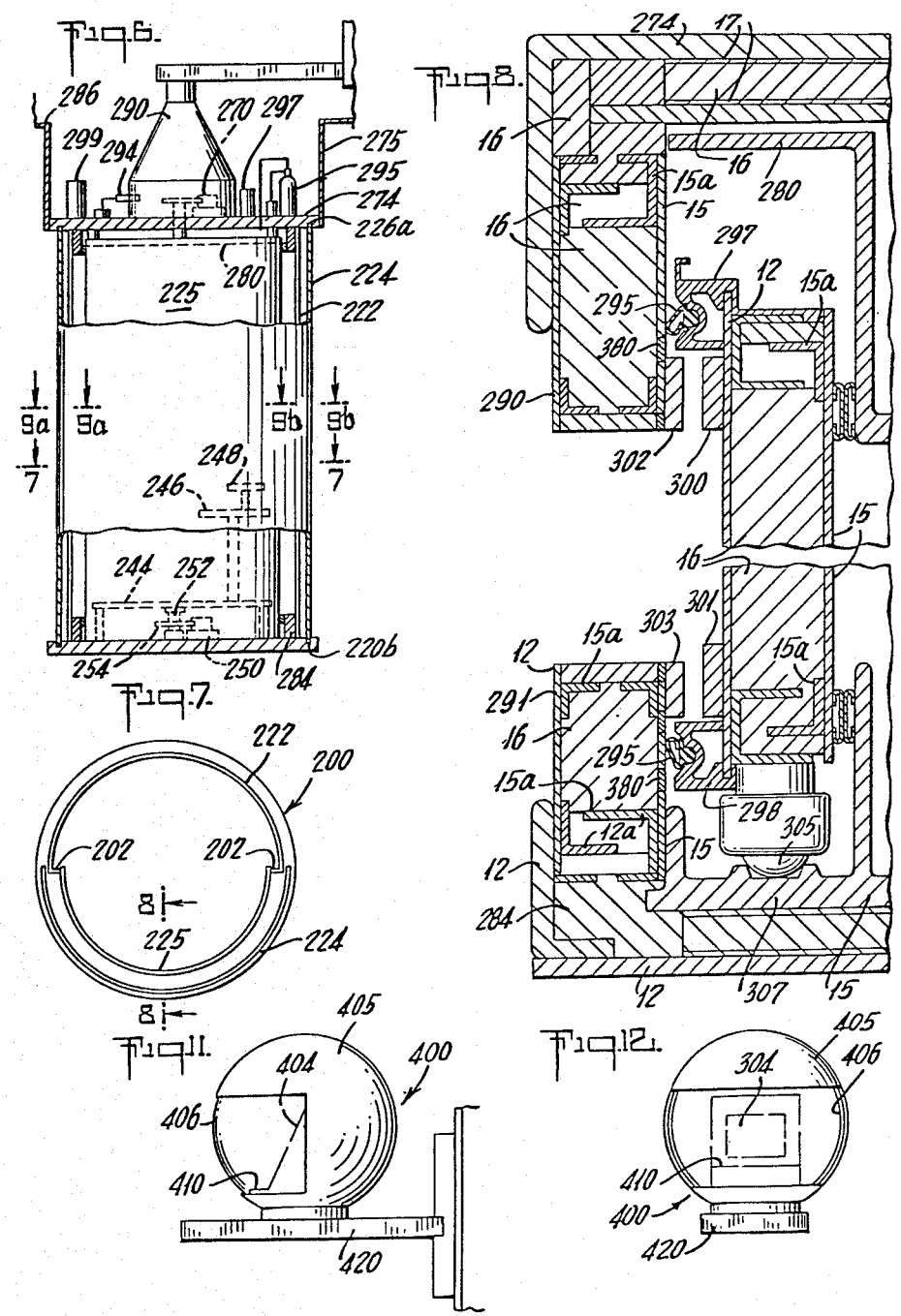

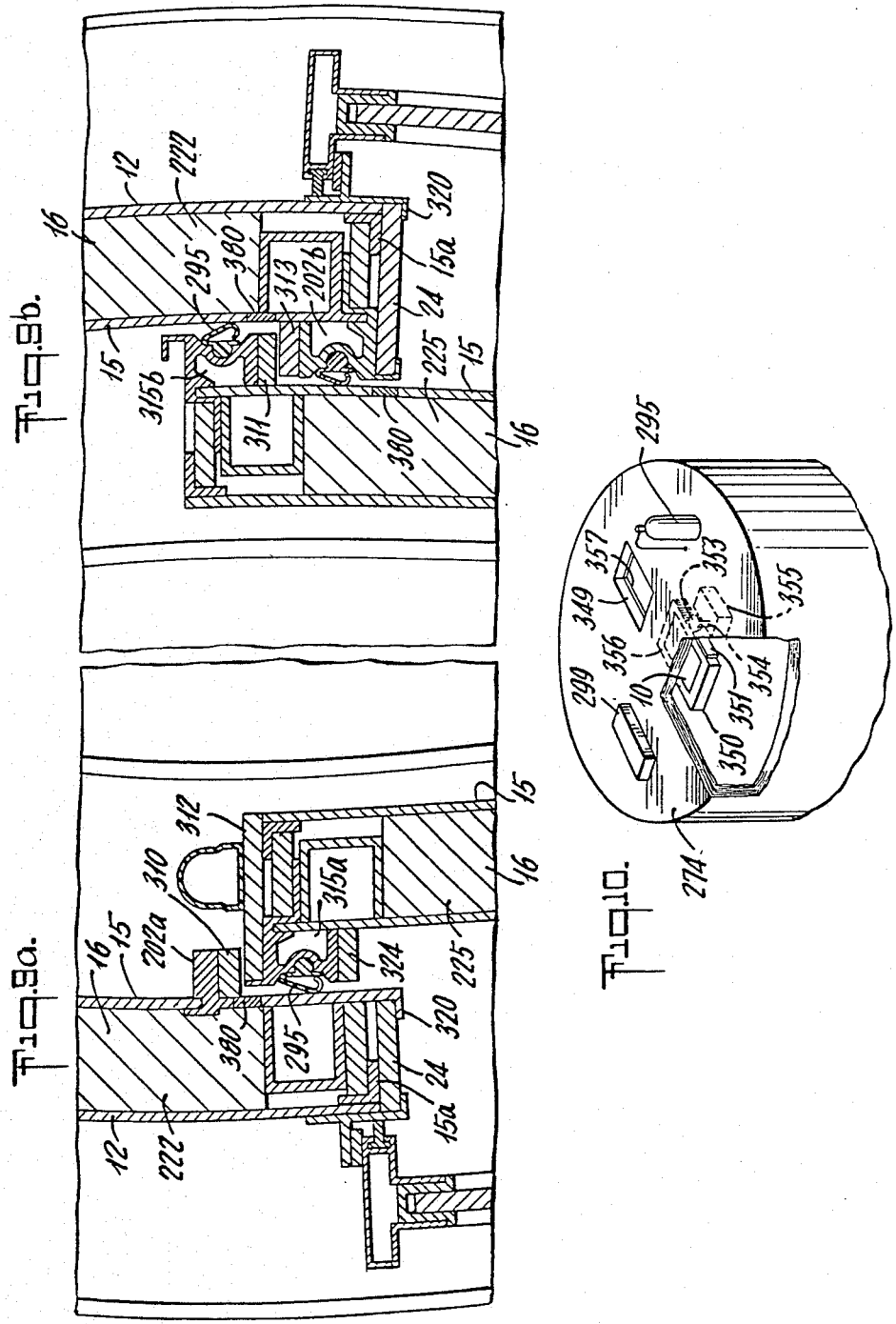

INSULATING APPARATUS AND COMPOSITE LAMINATES EMPLOYED THEREIN

This application is a division of application Ser. No. 788,693 filed Oct. 21, 1985 and now abandoned which is continuation of application Ser. No. 490,570 filed May 2, 1983 and now abandoned which is a divisional application of Ser. No. 102,552 filed Dec. 11, 1979 and now U.S. Pat. No. 4,381,716 which in turn is a continuation-in-part of application Ser. No. 912,974 filed June 5, 1978 and now abandoned.

BACKGROUND OF THE INVENTION

This invention relates to a transaction processing enclosure wherein the housing or walls, ceiling and floor are formed of a selectively light-weight, composite laminate, adapted for containment of electronic data processing equipment, banking apparatus, and other and related electrical and electronic equipment, and providing thereto a sustained insulated environment substantially immune to impact, for example, from bullets and projectiles, and to flame, smoke and extreme variations in temperature in the atmosphere external to the enclosure.

In general, heretofore, the exterior walls of, for example, buildings have been insulated and loosely packed, bulky materials such as fiberglass, which offer little fire protection. The use of asbestos employed occasionally to insulate girder bars, has abated because of the health hazard it poses. Furthermore, the contact between the surfaces of a building wall and supporting girders has been through direct metal to metal contact using metallic fastening elements such as rivets.

Similarly, conventional interior building walls have been constructed using gypsum ($CaSO_4.H_2O$) or similarly low cost mineral material clad in fire resistant papers with a dull finish. More commonly, gypsum board has been used in standard size sheets and attached to intermittantly disposed steel supports, with metal studs driven through the insulating material. These walls are, normally, fabricated however, at the construction site. They are permanent and not readily reusable or relocatable. The gypsum insulating elements have, typically, a density of 2.31–2.33 grams per cubic centimeter, thermal conductivities ranging from 3 to 9 BTU per hour per square foot per degree Fahrenheit per inch thickness, and total emissivity greater than 0.95. The use of conventional metal fastening elements facilitates heat transfer to the supports, as well.

The construction of the fuselage of aircraft, and, more recently, space craft, and the like including wings, where present, and engine compartments has, at the same time undergone a revolution in design over the past several decades resulting in a variety of different structures. Initially, for example, low altitude, low speed aircraft had simple metal skins supported at intervals with a contoured metallic frame. As standard altitudes and speeds have increased, the requirement for maintenance of an ever increasing temperature gradient between the interior and exterior of the craft has also measurably increased. At the same time, simultaneous need for a decrease in weight and an increase in structural strength has resulted in a variety of innovations, centering about two basic structural variations, the "honey comb" design and the composite wall design.

The "honey comb" design refers to the joining of inner and outer wall elements, most commonly metals, using interspersed connection elements, usually metals, fastened using rivets or similar agents. Recently, some adhesives systems have been developed which have had varied success in joining the elements of the skin wall together. However, few can withstand prolonged exposure to temperatures over 200° C. and most bonds formed by the adhesives tend to weaken with vibrational stress and exposure to moisture. Similarly, metal to metal contact is present through the elements of the structure.

The composite walls usually involve the joining of inner and outer metallic layers, with insulating materials disposed between them and supporting structural elements intermittently disposed therein in the form of ribs or struts. The insulating layers have rarely been bonded with success to the metallic layers and have not added significantly to the strength of the wall or skin so formed, in any event. Commonly, the supporting elements are also bound by metal to metal contact using rivets or other suitable fasteners to inner and outer metallic layers. Use of adhesives in this application, to join the metal surfaces and the supporting elements have similar limitations to those described above; that is low thermal resistance, sensitivity to vibration and bond sensitivity to moisture. In most embodiments, the metal to metal contact between the inner and outer layers is reduced but not eliminated.

In a significantly disparate area from that of aircraft fuselage design and construction, the vaults commonly employed to guard currency, other valuables including jewelry, securities, documents of importance and the like, have commonly been bulky structures with relatively thick walls. Most major bank vaults, for example, have concrete walls several inches to several feet in thickness to protect the contents from thermal damage in event of fire and to discourage and hamper forceful entry into the interior thereof by miscreants, vandals, felons and the like.

Ceramic compositions, most desirably, in fiber form, have also been used extensively heretofore as insulating or refractory materials in furnace walls and the like. These compositions may be utilized in randomly distributed fibrous form as well as in embodiments wherein the fibers are linked to form blankets, paper, felt, or fabric. Many ceramic fibers are composites containing varying amounts of silicon oxide ($SiO_2$) and aluminum oxide or alumina ($Al_2O_3$) as well as small amounts of other oxides such as sodium oxide ($Na_2O$), boron oxide ($B_2O_3$) and iron oxide ($Fe_2O_3$). Increasing the alumina content generally increases the thermal resistance of the refractory fiber. The preparation of a refractory glass wool useful as an insulation material and incorporating alumina and silica is disclosed in U.S. Pat. No. 2,557,834. Colloidal silica as a coating cement for graphite, metals and refractories is described in U.S. Pat. No. 3,231,401.

Other ceramic fibrous materials containing chiefly zirconium oxide ($ZrO_2$) hafnium oxide ($HfO_2$) and yttrium oxide ($YO_2$) have also been used as insulating and refractory materials in the various forms recited hereinabove and, indeed, have, generally, superior refractory properties. Thorium oxide ($ThO_2$) and tantalum oxide ($TaO_5$), have also been employed for these purposes.

Ceramic fiber forms such as the foregoing are characteristically pliable, and easily folded, cut, or rolled. However, treatment of these ceramic fibrous refractory materials with, illustratively, an aqueous solution containing a concentrated solution of the major component oxide in combination with additional amounts of particulate oxide; evaporation of the water present and drying of the fibers produces a non-pliant or a rigid ceramic fiber form. Solutions such as the foregoing are appropriately termed rigidizers and are well-known to those skilled in the art.

Further illustrating the development in this field, U.S. Pat. No. 3,385,915 recites a procedure to form fibers and articles including a variety of metal oxides; U.S. Pat. No. 3,663,182 recites a method for the formulation of metal oxide-containing fabrics; U.S. Pat. No. 3,860,529 recites means to render ceramic fibers composed mainly of $ZrO_2$ stable at temperatures of 1000° F. or greater; and U.S. Pat. No. 3,861,947 recites means to render zirconia fibers more thermally resistant by coating them with amorphous silica and reacting the two components.

Ceramic fiber refractory materials have been effectively employed to insulate walls of high temperature furnaces; as linings for molds to accept molten metals, especially aluminum; to protect high temperature components in combustion chambers, such as fuel nozzles; and in applications to seal entry points for cables and conduits entering areas of high temperature such as furnaces and nuclear reactors.

In the foregoing applications the ceramic fiber refractory materials have either been mechanically applied or cemented to surfaces to be protected thereby. Thus, U.S. Pat. No. 3,736,160 describes a fibrous zirconium oxide in a cement matrix containing zirconium oxide and a refractory powder; and U.S. Pat. No. 3,709,717 and U.S. Pat. No. 3,875,971 employ porcelain enamels for bonding zirconium oxide-containing refractory ceramic fibers to metals.

Other developments in the field have centered on containers for temporary storage and transplant of materials requiring maintenance at extremely low temperatures. A material effort in this area has involved improvements in vacuum insulation. Thus, U.S. Pat. Nos. 3,357,586, 3,007,596, and 3,009,600 are directed to the use of composite insulation systems in combination with a vacuum.

U.S. Pat. Nos. 3,108,706 and 2,900,800 deal with the elimination of gaseous hydrogen evolved from the metals forming the double walls of insulation containers and accumulated in the vaccum space provided between the foregoing walls.

At the same time while the refractory ceramic fibers are useful in construction of relatively thin-walled components, as described, illustratively, in U.S. Pat. No. 3,709,710 referred to hereinabove, that are capable of providing effective thermal barriers for many purposes, the load placed on these components is often exceedingly high, however, in that it does not provide for absorption of the radiant heat to which the ceramic fibrous materials are normally exposed. Other intumescent refractory compositions possessed of a low thermal conductivity are also well-known to provide seals for cable penetration through successive floors of buildings and, illustratively, on the interior surfaces of appliances such as hair dryers within a limit source of intermittent heat is present. These refractory intumescent materials are available for use in a variety of compositions including paints, coatings and the like.

It is known to provide closely controlled insulated environments for electronic data processing equipment (other than remotely disposed terminals and the like) by placing all of an organization's data processing equipment in a single large room where overall conditions are maintained substantially uniform, such as referred to hereinabove, and not by use of ceramic fiber panels. The construction of these thick, usually permanent and flame resistant walls is expensive; the location of the equipment is often inconvenient and not adaptable to change even where initially convenient and an accommodation to necessity rather than efficient utilization. A power failure, or the like, will necessitate, in the absence of an auxiliary power supply, a shut-down of an organization's entire electronic data processing system; and in modern terms, where, for example, banks are concerned, will cause closing of the entire business enterprises as well as other enterprises dependent upon it. This vulnerability exists, as well, with sensitive government installations.

The foregoing disadvantages have been overcome to a material degree by the provision of transaction processing enclosures or modules for housing electronic data processing equipment and the like, generally cylindrical in horizontal section, in a particularly preferred embodiment. These readily movable modules or transaction processing centers are described in detail hereinafter and in copending application Ser. No. 952,782 filed Oct. 19, 1978, a divisional application of the U.S. Pat. No. 4,121,523 of one of the applicants herein (and both of which are incorporated by reference herein), but the use of, for example, steel or the like alone in the walls or housing of these modules, while providing an adequate protective means for many purposes, manifests significant disadvantages.

In the event, therefore, that a strong integrated laminate could be devised that would incorporate reduced weight and significant flame and impact resistance and enhanced structural strength under adverse environmental conditions and even at extremely reduced and elevated temperatures and would at the same time prevent, substantially, the passage of radiant and conductive heat, a significant advance in the state of the art would be attained.

Further, if a module or booth could be devised providing containment for one or more units of electronic data processing equipment, banking apparatus, and the like, under which a controlled environment could be assured within the module and under even the most vigorous conditions of temperature and humidity external to the booth, and afford protection against impact and fire while affording structural strength, protection simultaneously, for information, stored for example, on magnetic tape and solid-state elements present in the equipment disposed in the module against the influence of external radio frequency energy and, inded, electromagnetic fields of all frequencies and concentrations, and comply with vigorous governmental requirements in these regards, a further advance of equivalent significant dimensions in the state of the art would be secured.

It is an object of the invention therefore to provide an improved thermal barrier, panel or housing combining low conductivity and high resistance to transfer of radiant heat within an extremely broad temperature range of the order of from about −273° Centigrade(C.) to about 3200° C.

It is an additional object of this invention to provide a light-weight, impact-resistant structurally strong, firmly integrated laminate capable of preventing transmission of both high and low frequency radiant energy in even high concentrations therethrough.

It is a still further and particular object of the present invention to provide a flame retardant, impact-resistant, structurally strong, module or enclosure for incorporation of electronic data processing equipment, electrically or electronically operated banking equipment and the like, including information retrieval systems using magnetic tape and solid state elements or chips that will be protected from either or both high or low radio frequency energy in both high and low concentrations; with maintenance of a desired stable atmosphere within the module or enclosure despite dramatic variations in temperature, relative humidity and the like exterior thereto.

The foregoing and other objectives and advantages of the invention will become more apparent from the description appearing hereinafter in conjunction with the accompanying drawing.

SUMMARY OF THE INVENTION

In one embodiment, the invention includes a module or enclosure, adapted to contain electronic data processing apparatus, transaction processing equipment and the like, incorporating a flame retardant, impact-resistant, structurally strong, relatively light-weight, insulated housing formed of a composite laminate comprising at least one outer ply, the exterior surface of which reflects radiant energy; at least one non-conductive heat insulating ply of a refractory ceramic fibrous composition mounted upon the interior surface of said outer ply; at least one structural support element disposed on the interior surface of said insulating ply remote from said outer ply; and a refractory adhesive composition disposed as separate plies between each reflective ply and each ply of refractory ceramic fibrous composition and each refractory ply and structural element. The support element may be one or more struts, a lattice, a continuous ply, hollow channel, I-beam, combinations thereof and the like.

In a preferred embodiment, there is present on the interior of said structural element a further refractory ceramic fibrous ply and an inner (radiant heat) reflective ply disposed upon its opposite surface with a ply of ceramic adhesive interposed between each of the foregoing plies. There may be a plurality of each type of ply adhering to one another by means of the foregoing adhesive ply and the succession of reflective and refractory plies can be repeated with interposing adhesive plies and repetition of the structural elements as well in the foregoing succession. The outer reflective radiant ply is preferably a metal such as chromeplated steel. The refractory ply is preferably a ceramic fibrous composition formed of a metal oxide and in significantly preferred embodiments, an alumina-silica containing composition, a zirconia-containing composition or a zirconiayttria containing composition. The adhesive, while non-fibrous, is of the same general chemical composition as the ceramic fibrous ply to which it adheres.

The transaction processing center of the invention comprises a vertically disposed housing, ceiling and base members composed of the foregoing laminate. The housing includes a stationary wall; at least one access means to the interior of the transaction processing center or enclosure; and closure means registrable with said access means. Mounted within the base of the center or enclosure desirably is at least one turntable, which provides economy of space by permitting rotation of the data processing apparatus or the like mounted upon the base for access to all parts of the apparatus through a single access means. Other and alternative means of servicing are also available. Heating, ventilation and air-conditioning apparatus and conduits are given entry to the interior of the booth through both the base and ceiling of the enclosure. To maintain the environment provided within the booth involves minimal energy requirements because of the laminate provided in the housing of the enclosure. Not only is the interior environment resistant or immune from dissipation through the housing, it is unaffected by the atmosphere exterior to the housing, as well as being secure against impact, fire and high structural loading; all of the foregoing necessary characteristics to proper containment and maintenance, illustratively, of electronic data processing equipment.

Intumescent flanges are, in a particularly preferred embodiment, mounted along the opposed slideably mounted margins or edges of the closure means and are in a further significantly preferred embodiment disposed in spaced relation to equivalent intumescent flanges mounted upon parallel margins of the housing and intumesce to occlude the space between them in the event they are exposed to elevated temperatures.

BRIEF DESCRIPTION OF THE DRAWING

FIG. 1 is a perspective view of a composite laminate panel for use in an enclosure or housing in accordance with the invention.

FIG. 2 is a perspective view of a further embodiment of a composite laminate in accordance with the invention.

FIG. 3 is a fragmentary perspective view of a still further modification of the laminate panel employed in the practice of the invention.

FIG. 4 is a perspective view of a panel having a preferred conformation for use in the enclosures or transaction processing enclosure of the invention.

FIG. 5 is a perspective view of a transaction processing enclosure of the invention.

FIG. 6 is a broken side elevational view, with elements thereof depicted schematically, of a module or transaction processing center in accordance with the invention.

FIG. 7 is a horizontal sectional view, of the transaction center taken along the lines 7—7 of FIG. 6.

FIG. 8 is a fragmentary greatly enlarged side elevational view, with elements thereof shown schematically, taken along the lines 8—8 of FIG. 7 showing closure and access means in detail but without outer closure means in place.

FIG. 9a is an enlarged view in greater detail of the closure means shown in FIG. 7 taken along the lines 9a—9a in FIG. 6 without the outer closure means.

FIG. 9b is an enlarged view in greater detail of the end portion of the closure means shown in FIG. 7 taken along the lines 9b—9b in FIG. 6 without the outer closure means.

FIG. 10 is a partially broken perspective view of a particular embodiment of the transaction processing enclosure of the invention with elements thereof shown schematically.

FIG. 11 is a side elevational view of an alternative embodiment of a transaction processing enclosure or module such as depicted in FIGS. 5, 6 and 7 with some elements thereof shown schematically.

FIG. 12 is a front elevation view of the transaction processing center shown in FIG. 11.

DESCRIPTION OF THE PREFERRED EMBODIMENTS

Referring now in detail to the accompanying drawing there are shown in FIGS. 1, 2, 3 and 4, particularly, several embodiments of a composite laminate 10 for use in modules or transaction processing enclosures coming within the purview of the present invention and shown in FIGS. 6 to 12. The composite laminate 10 includes an outer ply 12 which is formed from a flame retardant composition, a metal most desirably, having a reflective surface and, in a preferred embodiment, impact resistance. This exterior ply is adapted to reflect radiant heat and, at least in that embodiment in which it is the sole barrier to material transfer of radiant heat, is likewise adapted to reflect and serve as a barrier to transmission of electromagnetic radiation, of low, intermediate or high frequency and combinations thereof at low, intermediate and high concentrations thereof.

As will be evident by reference to FIG. 3, a reflective ply 14 can be and is desirably present as the inner layer of the laminate, as well. The two reflective layers may be of the same or different metals. A plurality of recurring reflective plies such as 12 and 14 may be employed advantageously in the laminate on either side of the structural element 15 (and 15a) as seen in FIG. 3.

Disposed adjacent the inner surface of the reflective element 12 is a refractory ply 16 composed of a ceramic fibrous material. The several foregoing plies and elements of the laminate are made to adhere to one another by means of a plurality of further refractory plies 17 of a ceramic adhesive, normally and most desirably, inorganic and of a chemical composition similar to that of the ceramic refractory fibrous adhesive plies that they abut on at least one surface. The adhesive plies are, however, non-fibrous and are deposited on the surfaces that they are to bond together from an aqueous or other dispersion, and then heated. The ceramic fibrous ply and the non-fibrous adhesive plies are composed of metal oxides, illustratively, alumina and silica together with reduced amounts of an alkaline oxide. These refractory plies provide a low thermal conductivity and are resistant to degradation at extremely elevated temperatures. At the same time, they provide insulation against extremely low or cryogenic temperatures or with intrumentation and electronic data processing apparatus requiring these temperatures for effective operation; and will sustain these temperatures within the transaction enclosures.

In the preferred embodiments of FIGS. 2, 3 and 4 there are at least two ceramic fibrous non-conductive or refractory plies 16 and 18 in the composite laminate; the ply 16, as indicated, attached to the outer reflective ply 12; and the second interior fibrous refractory ply 18 adhering to a structural component or ply 15. Both fibrous refractory plies adhere, by means of the adhesive plies 17, as indicated, to the structural element 15 interposed between the two refractory plies 16 and 18. A second or interior reflective ply 14 used to intercept any residue of radiant heat or energy, emanating from a source exterior to the panel and the outer reflective ply 12 may be mounted on the second interior refractory ply 18 as shown in FIGS. 3 and 4. This interior ply 14 will, of course, also serve to contain any radiant heat and electromagnetic radiation within the enclosure formed by the laminate 10.

As indicated elsewhere herein, it is within the contemplation of this invention to embrace alternating plies of the reflecting and refractory panels in greater number than those shown herein although for the purposes of this invention the total number of each will, for purpose of convenience and economy and the particular application envisioned, extend to about five of each on each side of a single structural element 15 (of which, however, there may be two or more as well either in recurring sequence or together as in FIG. 3). As will be evident, essential to the practice of the invention is the presence in the laminate 10 of at least a single reflective ply, a single fibrous refractory ply and a single structural element, each of said reflective ply and said structural element being disposed upon opposite surfaces of said fibrous refractory ply and bonded thereto by an adhesive ply of non-fibrous ceramic refractory material. It is also feasible within the laminate structure provided to include separate and successive adhering plies of the same or similar composition; for example, successive metallic plies of the same or different metals, or refractory plies of the same or different ceramic fibrous materials.

Where the enclosure is intended to resist great stress it is appropriate to include a plurality of structural elements such as the ply (15) and beam (15a) combination shown in FIG. 3, wherein the ply 15 and structural beam 15a are desirably but optionally made to adhere to one another by means of a ply of ceramic adhesive 17 interposed between the two. Where fibrous refractory plies are mounted upon both sides of the structural element 15 or elements 15 and 15a the structural integrity of the booth is further assured from the enclosure's interior as well as its exterior. This assurance is increased by inclusion in the enclosure housing of an additional reflective radiant ply as well. The presence of this latter ply has the added advantage of providing an interior surface that may be made of an impact resistant material; a consideration where the enclosure is sufficiently large, as it may be in accordance with the invention, to provide occupancy to one or more persons.

The structural elements 15, and 15a where present, are made from structurally strong materials, especially those resistant to damage from elevated or reduced temperatures or material changes in temperature; and most particularly metals, and illustratively iron, aluminum, steel and magnesium, titanium and nickel alloys. The selection of a thickness and configuration is based in part on the size of the enclosure and the weight of associated equipment disposed within the enclosure. The structural elements, in an embodiment that meets particular objectives of the invention, is most desirably made of a strong but light weight metal or of a gauge to permit and enhance the capacity for ready and manual movement and, in this sense, the portability of the transaction processing enclosure of the invention.

The structural element may be a ply as described elsewhere herein, a beam, strut, lattice or other known configuration. If beams or struts, illustratively, they can be arrayed horizontally, vertically or at a variety of angles therefrom or integrated in a combination thereof. In any of the foregoing forms they may also assume a variety of angular or curvilinear patterns. As shown in FIG. 3, the structural ply 15 and beam or strut 15a occur in combination in a single panel of housing.

The large enclosure 200 of FIGS. 5, 6, 7 and 8 will, by way of further illustration, and without limiting the scope of applicant's invention, stand about 7 feet high at the supra module partition 274 with an approximate diameter of 5 feet and uses, illustratively, structural elements 15 of aluminum alloy 3003 H 14 ranging in thickness from 0.032 inch to 0.5 inch with the most preferred range extending from 0.375 inch to 0.063 inch. Stainless steel ranging in gauge from 10 to 18 is also useful in this embodiment and preferred in those instances particularly where strength as contrasted with weight is significant. In contrast, a small enclosure 400 as shown in FIGS. 11 and 12 will employ, by way of further illustration, an aluminum structural element having a thickness of from 0.01 inch to 0.125 inch with a preferred range of from 0.020 inch to 0.040 inch. The secondary structural element 15a, too, may be of channel, angle, I-beam, or other construction as noted elsewhere herein and vary in thickness in a preferred embodiment, from 0.032 inch to 0.50 inch with a significantly preferred range of from 0.063 inch to 0.125 inch.

Significantly preferred in the practice of the invention is a cylindrical side-wall housing which can be formed from one or a plurality of, semi-cylindrical panels such as shown, for example, in FIG. 4. This particular conformation has been found to provide significant advantages to the module including an enhanced capacity to reflect radiant heat and electromagnetic fields.

The reflective ply 12 of plies 12 and 14, by way of illustration, or any repetition thereof in accordance with the invention, is formed of a material having a highly polished surface, adapted, as indicated, to reflect radiant heat and electromagnetic radiation. Suitable metals for use in the practice of the invention, are by way of illustration and not of limitation, polished steel, a steel, and copper or aluminum ply, aluminum, aluminum alloys, titanium alloys, cadmium alloys and chrome plated metals such as steel, chrome nickel steel, chrome manganese steel, chrome steel and stainless steels. Specific illustrative steels useful for the purposes herein described are types ASTM 410, 414, 420 and 430. Particularly preferred is a chrome-plated steel having a low total emisivity within the range of from 0.02 to 0.2 at 25° C. (as characterized in the Handbook of Chemistry and Physics, 50th Ed. 1969-1970. The Chemical Rubber Co., Cleveland, Ohio p. F-90).

As the reflective plies 12 (and 14 where present, and such additional plies thereof present) are, characteristically, excellent conductors of thermal energy, the panels 10, where not formed to provide a unitary housing for the transaction processing enclosure are brought into direct abutment by welding, or other standard means for providing an integral unit, so that heat from a source of thermal energy or an electromagnetic field applied to a selected portion of the panel or housing surface will be rapidly dissipated over the entire area provided by said panel and any adjacent panels forming the walls, ceiling and base of the transaction processing enclosure. In bringing the reflective plies into abutting relation, the refractory layers of contiguous panels are brought into contact as well, and may be made to adhere to one another by means of a ceramic refractory adhesive.

A lamina formed of a metal such as the foregoing for use herein will be, in a particularly preferred embodiment, from 18 to 28 gauge (0.0149 inch to 0.0478 inch respectively) in thickness, and most desirably of about 24 gauge. Greater thickness; for example, up to 0.375 inch and greater are operative, and, indeed, for some purposes, as where security against vandals and physical attack are involved, are preferred. The individual laminae of reflective plies such as 12 and 14, for example, are, in one embodiment, desirably formed of different metals, for example, the outer lamina or ply 12 of polished steel that is generally invulnerable to physical impact and is, for example, bullet-proof, while providing a barrier against low frequency electromagnetic fields; and an inner ply made of aluminum or copper that is substantially impervious to transmission of high radio frequency energy. The object served by this combination is the protection of any information stored or being used in the transaction processing enclosure such, for example, as magnetic tapes, disks, solid state elements or "chips" and capacitor memories from damage, deliberate or inadvertent, effected by radio frequency energy of low and even very high concentrations including background radiation.

The reflective plies such as 12 (and 14, where present) are intended particularly where disposed externally and internally to the structural element 20, to provide protection from both radiant thermal energy and possible fire damage and to contain and limit any fire occurring in the transaction processing center to the unit as well as preventing penetration of fire or undesired temperature changes from the exterior either directly or as a result of undermining the structural integrity of the booth. The concern here is particularly significant since fires occurring in connection with electrical and electronics equipment tend to be particularly persistent and damaging.

Other metals or alloys thereof such as lead may be incorporated additionally where concern is had with selectively adverse conditions such as X-rays to which contained equipment of the transaction processing center may be particularly vulnerable.

The refractory plies of the composite laminate 10 are formed of metal oxide fibers characterized by their great refractory capacity, low thermal conductivity, and resistance to chemical attack. The fibers often and desirably include stabilizers that permit the insulation to continue to be effective above the melting point of at least certain of the insulating metal oxide fibers that could not otherwise be used to advantage.

The fibers for use in the refractory plies of the panels and housings 10 of the invention are those incorporating, as at least a significant or major portion by weight, oxides of one or more metals, beryllium, hafnium, magnesium, calcium, strontium, barium, scandium, silicon, yttrium, lanthanum, cesium, titanium, zirconium, vanadium, niobium, tantalum, chromium, molybdenum, tungsten, manganese, iron, cobalt, nickel, copper, zinc, lead, thorium, and the like. Illustrative of the foregoing oxides are $BeO$, $MgO$, $CaO$, $SrO$, $BaO$, $SiO_3$, $Y_2O_3$, $LaO_2$, $CeO_2$, $TiO_2$, $ZrO_2$, $V_2O_3$, $Na_2O_3$, $Ta_2O_3$, $CrO_2$, $SiO_2$, $HfO_2$, $MoO_2$, $WO_2$, $MnO_2$, $FeO_2$, $Co_2O_3$, $Ni_2O_2$, $CuO$, $ZnO$, $CdO$, and $Al_2O_3$. Other oxides that may be present in combination with one or more of the foregoing oxides are, illustratively, $B_2O_3$, $P_2O_5$, $Na_2O$, and $K_2O$.

The fibers for use herein have a mean average fiber length of from as little as about 1/16 inch to about 3 inches or more in length and an average fiber thickness of from about 3 microns to about 10 microns or more. Preferred are those fibers having mean average fiber lengths of from ¼ to 3 inches, with an average diameter of from 3 to 10 microns and most desirably 2 to 6 microns. These ceramic fibers are well known to those skilled in the art to which this invention pertains and are prepared generally by the following illustrative procedures, the first of which, by way of illustration, involves impregnating a preformed organic polymeric material, such as cellulose, rayon, silk and the like, with one or more salts or hydrolysis products of salts of metal elements that form the metal oxides referred to hereinabove; heating the impregnated organic material under conditions effective in preventing ignition and in the presence of an atmosphere including an oxidizing gas at a temperature sufficient to pyrolyze the organic material. The resulting carbon is removed as a carbon-containing gas and the metal or metals present are oxidized to their respective metal oxides. The metal oxide fiber has a configuration similar to that of the original polymeric material. This method is adapted particularly to the production of zirconium oxide fibers. In another preferred embodiment, the metal oxide and other components are mixed thoroughly in an arc furnace until a bath of molten material is formed. The furnace is then tilted to allow the molten material to pour from the furnace in the form of a small stream which is struck at substantially right angles by a stream of compressed air. The stream of molten material is dissipated in the form of fine fibrous material which is collected upon a mesh screen or revolving drum positioned several feet in front of and downstream from the furnace. This process is adapted particularly for use in the preparation of aluminum oxide fibers.

In addition to the desired fibers, a portion of the product assumes the shape of pellets. These pellets, often referred to as "shots", are substantially removed in the collection of the fibers as described hereinabove. The elimination of this pellet sized material increases the refractory quality of the fibrous material formed.

Preferred fibers are those made from aluminum oxide and zirconium oxide.

A particularly preferred aluminum oxide fiber for use in the practice of the invention that will retain its integrity as a refractory material at elevated temperatures is that formed by melting and fiberizing mixtures of alumina ($Al_2O_3$) and silica ($SiO_2$), wherein aluminum oxide is present by weight of alumina and silica content within the range of about 40 percent to about 95 percent and preferably about 51.7 percent to about 92.8 percent, and silica is present in an amount of from about 60 percent to about 5 percent, and preferably, about 48.3 percent to about 7.2 percent respectively.

There are present, as well, incorporated normally in the alumina employed, additional trace amounts of $SiO_2$ and an alkali metal oxide; the former in percentages normally of up to 0.03 percent or more; and the latter, usually as $Na_2O$, and less frequently as $K_2O$, in amount of up to about 1.0 percent by weight. Iron oxides, particularly $Fe_2O_3$, in amounts usually of up to about 0.03 percent and titanium oxide in an amount of up to about 0.005 percent, with water, free and combined of up to 2 percent, may and usually are present, as well. The foregoing references to percentages are to percentages by weight of the alumina in which the components recited are contained. Up to about 7.5 percent of the silica incorporated in the refractory composition of the invention may be substituted by zirconia in one series of embodiments. Of course, zirconia can substantially replace the alumina in an alternative embodiment as discussed more fully elsewhere herein.

A significantly preferred alumino-silicate formulation for use herein sold by Alcoa as tabular alumina under the trade designation, T-61, incorporates the following components in the percentages by weight indicated: $Al_2O_3$—99.5% and more; $SiO_2$—0.02%; $Na_2O$—0.02%; $Fe_2O_3$—0.03%; $TiO_2$—0.005%. An alternative alumina source also preferred, and less expensive, and also sold by Alcoa as A-1 grade white alumina contains the following components in the following percentages: $Al_2O_3$—98.89%; $SiO_2$—0.03%; $Na_2O$ (combined) —0.50%; $H_2O$ (free) —1.25%.

The silica sources most conveniently employed are flint and white sand. Preferred aluminum oxide fibers of the foregoing character are thus prepared illustratively as follows:

A batch of A-1 grade white alumina ore (Alcoa) in an amount of 50 parts by weight; flint, 50 parts by weight; and 1.5 parts by weight of borax ($Na_2B_4O_7$) are mixed thoroughly and fused in an arc furnace of the type commonly used for making alumina abrasive materials until a substantial bath of molten material is obtained. The furnace is tilted and the molten mixture is poured from the furnace in the form of a small stream impinging on the stream from a right angle. A stream of compressed air under 80 pounds per square inch pressure can be substituted for the same jet. The stream of molten material is transformed into a mixture predominantly of pellets or "shot" and the desired fibers that are then collected upon one-quarter inch mesh screen placed in front of, and about 5 feet removed from, the furnace. The shot is removed substantially. The resulting fibers or fibrous glass manifest the following composition: $Al_2O_3$—52.67%; $SiO_2$—45.77%; $B_2O_3$—1.06%, and $Na_2O$—0.50%. Other illustrative and preferred refractory fibrous aluminum oxide products for use in the present invention include fibers composed of $Al_2O_3$—50%; $SiO_2$—about 50%; with trace amounts of $Na_2O$, $B_2O_3$ and $Fe_2O_3$; and, specifically, 51.7% $Al_2O_3$, 47,6% $SiO_2$, 0.3% $Na_2O$, 15% $B_2O_3$ and 0.02% $Fe_2O_3$.

The foregoing fibers can be used in effective refractory plies herein at continuously maintained temperatures as high as 1290° C. and for briefer periods up to 1793.33° C. A preferred range in density for the foregoing alumina fibers are within the range of 0.12 grams per cubic centimeter (g/cc) to 0.25 gcc. The thermal conductivity of the preferred alumina fibers is within the range of 0.5 Btu/hr. ft.$^2$°F.$\times 10-3$ at 400° F. to 0.7 Btu/hr. ft.$^2$°F./in. at 1200° F.

As indicated, other particularly useful ceramic refractory materials are derived from zirconium oxide-containing fibers. These compounds are prepared advantageously using the relic process in which organic polymeric materials are employed as described generally elsewhere herein.

These latter fibers are prepared by impregnating an organic polymeric material characterized by a structure of extremely small crystallites held together by a matrix of amorphous regions that enlarge and admit the metal compounds on immersion in a suitable solvent. These include, illustratively, cellulosic materials such as rayon, saponified cellulose acetate, cotton, wool, and ramie; protein materials such as silk or wool; and polyesters, acrylic polymers, polyvinyl chloride, polyvinyl acetate and the like, and polyester urethanes and polyether urethanes. Particularly preferred is rayon because of its structural uniformity, good imbibition, and low impurity content.

The rayon is caused to imbibe 0.25 mole, and preferably 1.0 mole, to 2 moles of zirconyl chloride for each glycosidic unit or mole of the cellulose chain. Other zirconium compounds such as zirconium acetate, zirconium oxalate and zirconium citrate may also be used. While zirconia has a fusion point of 2677° C. and is thus an excellent refractory material, zirconia undergoes a phase change from the monoclinic to the tetragonal form at about 1000° C. Zirconia is however readily stabilized by heating in admixture with one or more Group III B metal compounds. The zirconia is conveniently stabilized however by firing it to 1700° C. or higher with 11.5 to 15 weight percent yttria to produce the cubic form or by firing at similar temperatures with 8–15 wt.% magnesia, 6–15 wt.% calcia, silica, scandia, and oxides of the rare earth metals such as lanthanide metal oxides. Discussions of other known methods stabilizing zirconia can be found in Ryschkewitz, Eugene, Oxide Ceramics, pp. 364–367 Academic Press, New York (1960); Campbell, I. E., High Temperature Technology, pp. 77–81, John Wiley & Sons, Inc. New York, N.Y. incorporated by reference herein. With non-cellulosic materials, the degree of imbibition extends from at least 0.1, and preferably 0.5, to 1.0 gram equivalent metal ion in the metal compound imbibing solution per gram of organic material. Imbibing of the zirionyl chloride is effected using a water medium at a temperature of from 50° C. to 65° C. to shorten the period of immersion. Excess moisture is removed by blotting of the fibers with absorbent paper, high velocity gas streams, vacuum filtration or centrifugation. The fibers are then dried and heated to a temperature of between about 400° C. and about 800° C. at a rate between 10° C. per hour and 100° C. per hour in an atmosphere containing from 5 to 25 volume percent oxygen and thereafter maintaining the fibers at a temperature of 400° C. to 800° C. in an oxygen-containing atmosphere until all of the original organic fibers have been reduced to carbon and volatilized and substantially all of the zirconium present has been oxidized to zirconium oxide. The foregoing process permits a range of process variables in addition to those described and directed particularly to avoidance of ignition and burning of the organic portion of the impregnated organic material. The process can be modified, as well, to provide a continuous process.

Other variations in permissable reaction conditions are illustrated by the following three methods, wherein, in all instances, the cellulosic fibers are immersed, as described above, in an aqueous solution of zirconyl chloride, excess solution removed from the impregnated fibers and the fibers dried.

In the first illustrative method the carbonization-oxidation step is carried out by heating the fibers in air at a uniform rate from room temperature up to 400° C. over a 24-hour period. The fibers are then heated in air at temperatures between 400° C. and 600° C., preferably closer to 600° C., for an additional period of up to twenty-four hours. This procedure is illustrative of ignition control by slow oxidation over a long period of time.

In the second method the carbonization-oxidation step is carried out by heating the impregnated fibers in an argon atmosphere from room temperature to temperatures between 600° C. and 1000° C. in less than one hour. The oxidation is then carried out by maintaining the fibers at about 800° C. in an atmosphere of argon containing at least 5 volume percent water vapor for a period of one to ten hours. This procedure is illustrative of ignition control by rapid pyrolysis in a non-reactive atmosphere followed by rapid high temperature oxidation using oxidizing agents of relatively low reactivity.

In the third method the impregnated fibers are rapidly heated, often in less than five minutes, to about 400° C. in an atmosphere containing less than approximately 10 volume percent oxygen. The oxygen partial pressure is then gradually increased at constant temperature until the carbonaceous material from the cellulose and the metal compound have been oxidized, generally in a period of $\frac{1}{2}$ to 3 hours. This procedure avoids ignition by direct control of the oxygen partial pressure in the environment of the fiber.

Hydrolysis of the zirconyl chloride is also used to effect imbibition of the metal into the organic polymeric material in an alternate embodiment.

The foregoing metal oxide fibers when used in the laminae of the invention can be formed for this purpose into board, paper, felt, batting and fabric forms well known in the art and including random distribution of the fibers. The term "fabric" is intended to embrace compositions wherein the fibers have been interlocked, including woven, knitted or braided articles, for example, including certain felts wherein the individual fibers are interlocked by needle punching, after felting.

Preparation of fibers such as the foregoing and fabrics employing these fibers are described in U.S. Pat. Nos. 2,557,834; 3,406,025; 3,663,182; and 3,385,915. Ceramic fibers formed primarily of zirconium oxide, and rendered stable to temperatures of 1000° C. and above are described in U.S. Pat. Nos. 3,663,182 and 3,860,529 and the fibers of U.S. Pat. No. 3,861,947 reciting additional means for rendering zirconia fibers more thermally resistant by coating thereof with silica are also useful in the fibrous refractory plies such as 16 and 18 employed in the practice of the invention. The foregoing patents are incorporated by reference herein.

Whether characterized as felts, fabric, boards, paper or the like, the refractory plies employed herein composed of plies of ceramic fibers and whether of alumina and silica or zirconia or, indeed, hafnium oxide or yttria, will retain their integrity and will provide effective resistance and low thermal conductivity to temperatures exterior to or present in the interior of the transaction processing center for extended periods of time; even up to 2200° C. in many cases. This is particularly significant because the reflective layers such as 12 and 14 and the structural elements or plies 15 and 15a will often be unable to survive these temperatures. For this reason it is particularly desirable to provide refractory plies that are rigid, a property that is readily infused into each of the fibrous plies by methods well known in the art and in a manner such as described hereinafter.

The fibrous refractory ply 16 will, by way of illustration, in the event fire and heat have destroyed the outer metallic reflective ply 12, preserve the integrity, under rigorous conditions for extended periods of time, of the structural elements 15 and 15a which are isolated from the ambient atmosphere external to the enclosure 200 (such as shown in FIGS. 5 to 8 hereof) or 300 (seen in FIGS. 9 and 10) even with the removal of the outer ply 12. The structural elements 15 (and 15a) are similarly protected from an electrical fire or the like in the enclosure's interior by one or more panels 18. The reflective ply 14 will, of course, be preserved for a period of time, where the fire is external to the enclosure 200 and will continue to retain its structure and its ability to insulate its housed data processing equipment from the adverse environment without. The same is also true with respect to the external reflective ply 12 where a fire or other dramatic escalation of the temperature occurs inside the enclosure 200.

The refractory plies 14 and 16 and any replication thereof that may occur, have thicknesses of from about 1/32 to about 3 inches, and more desirably 1/16 to 2 inches for most purposes and preferably from 1/16 inch to ⅛ inch. The assemblies of fibers whether felts, batting, fabrics or the like when compacted to the foregoing thicknesses, manifest an enhanced reduced thermal conductivity.

It is particularly advantageous for application in the practice of the present invention to form plies 16 and 18 of the panel or housing 10 in the form of one or more layers of metal oxide fibrous paper, each layer having a thickness of from 5 to 30 mils. Where, as significantly preferred, a plurality of layers of papers are employed to form any single ply, 16 or 18 for example. the fibers will manifest desirably a substantially parallel orientation in any single layer, and will be similarly oriented but perpendicular thereto in the succeeding layer to enhance the strength of the resulting ply 16 or 18 and the resulting panel 10. A thin coat of ceramic refractory adhesive may be used between these layers of paper. This increased strength is particularly effective where the ply 16 or 18 is rigidized, as described hereinafter. The presence of a plurality of layers of ceramic fiber in the refractory ply will enhance the resiliancy of the ply and panel 10 where the ply components are not rigidized. This feature is employed in a particularly advantageous manner to improve the impact resistance of the panel 10. Thus, where concern exists for a possible explosion on, or adjacent to, the exterior reflective ply 12, the outer fibrous refractive ply 16, if resiliant and non-rigidized, will better absorb and dissipate without fracture the effect of detonation. The second or subsequent interior fibrous refractory plies 18 may be rigidized desirably as the risk of fracture is reduced, thus absorbing and reflecting the residual impact of explosion while adding to the structural strength of the panel 10 and thus limiting its ability to penetrate the enclosure 200. Where several layers of ceramic fibrous paper are employed, in forming a refractory ply their individual thicknesses are normally within the range of about 0.012 inch to about 0.125 inch at 0 psi pressure and about 0.095 inch at 8 psi pressure. Thicknesses of up to 0.25 inch at 0 psi pressure are also operative.

In any case, a plurality of alternating reflective and refractory plies exterior to the structural element 14 are normally preferred. The first fibrous refractory ply may then be flexible, for example, where two such plies are disposed exterior to the structural element, and the second, rigidized to protect this latter element from fracture and, as a consequence, the integrity of the enclosure.

For particular applications the election of which plies should be rigidized can be reversed as, for example, where the explosion is viewed as more likely to emanate from the enclosure's interior in which the effect of this reversal will be to aid in containment of the explosion. As the various plies of the panel or a plurality of these panels forming the enclosure 200 or 300 are continuous so is the structural element or ply 15. Accordingly, the element 15 is isolated from the exterior environment by at least a single radiant reflective ply 12 and a single ceramic refractory ply 16, as well as the refractory adhesive plies 17. Consequently, where extremely high temperatures do transmit heat through the exterior plies 12 and 16 to the element 15, this latter component, formed usually of a good conductive material, will dissipate which residual heat throughout the entire element 15 of the enclosure 200 or 300. In this event, however, it is particularly desirable to have at least one fibrous refractory ply 18 as well as the additional refractory adhesive plies 17 disposed internally of the structural element 15 to insulate the interior of the transaction processing enclosure 200 and its contained apparatus from the heat of the structural element.

It will be evident too that the composition of successive refractory plies and particularly those on opposite sides of the structural element may vary in thickness, composition and physical properties such as density and consistency within the parameters defined herein.

As indicated heretofore, the several elements of the composite laminate of the invention adhere to one another by means of the adhesive plies 17 employing a ceramic adhesive. Significantly preferred are the metal oxide-containing refractory adhesives. These latter adhesives may also be applied as well to bonding and rigidizing of the fibers of each refractory ply.

Among the inorganic refractory adhesives for use in the practice of the invention that remain effective at elevated temperatures e.g. 1260° C. and significantly above, are colloidal silica, colloidal zirconia and colloidal alumina. These adhesives have particular application with aluminum silicate fibers characterized hereinabove wherein the fibers have an alumina content of from about 45 to 95 percent.

The foregoing inorganic oxides employed as adhesives, i.e. colloidal silica, colloidal zirconia and colloidal alumina, are employed as aqueous dispersions, preferably in a range of 1 percent to 30 percent of oxide by weight of the total dispersion.

In a preferred embodiment these colloidal adhesives are prepared including ceramic fibers e.g. those containing 51.7% $Al_2O_3$, 47.6% $SiO_2$, 0.3% $Na_2O$, 0.15% $B_2O_3$ and 0.02% $Fe_2O_3$ or small amounts of zirconia in the order of less than 1%, that are reduced in length by grinding, for example, in a ball mill, until the fibers have a length to diameter ratio predominantly in the range of from about 10:1 to about 50:1. The milled fibers are mixed with an aqueous dispersion of the foregoing oxide, sufficient oxide being used to provide an oxide content of from 3 percent to about 40 percent by weight of the mixture on a dry basis. The mixture is then applied to a ply of the larger ceramic refractory fibers described hereinabove in which the mixture may be utilized as a binder and as a surface coating to cause the ply to adhere to successive coats thereof and ultimately and in any event to bond the refractory ply or plies to the radiant reflective layers and structural elements of the composite upon curing thereof.

Curing is effected by heating of the laminate, or portions thereof to which the adhesive has been applied, in an oven at a temperature of about 200° F. Curing can also be effected desirably over longer periods of time at room temperature. Rapid curing, at temperatures up to about 2000° F., will result in porous structures, and may be undertaken where porosity is not a concern.

The foregoing adhesive includes about 3 percent to about 40 percent of metal oxide derived from the colloidal oxide on a dry weight basis and milled aluminosilicate fibers. A preferred proportion of colloidal oxide, for example, silica, is about 10 percent to about 15 percent and most desirably about 10 percent.

Other desirable adhesives in the practice of the invention for bonding of ceramic fibrous plies of alumina silicate to one another and particularly to the reflective radiant plies and structural elements of the invention are zirconia-containing adhesives containing at least 85 weight percent zirconium oxide; and preferably from 1 percent to 5 percent by weight of silicon oxide. Particularly preferred, where the composite laminate 10 of the invention is to be exposed to elevated temperatures are compositions such as the foregoing including up to 10 weight percent of yttria. Yttria stabilizes the zirconia against decomposition up to about 4000° F.

An illustrative zirconia-containing adhesive composition for use herein is one containing by weight 86% $ZrO_2$; 8.8% $Y_2O_3$; 3.6% $SiO_2$; 1.2% $K_2O$ and $Na_2O$ and other trace inorganic components in an amount of 0.3%. As in those instances where a colloidal metal oxide is employed, drying and curing occurs at room temperature over a period varying from a few minutes to a day or more depending inter alia on the humidity, temperature, and amount and size of the article involved. Drying and curing are readily accelerated, where desired, by heating of the composite laminate incorporating the adhesive at up to about 200° F. The curing step is also completed desirably by heating to a temperature of 800° F. Where the final curing step is completed at this latter temperature the laminate is more stable to wet or humid conditions and all volatile components are eliminated prior to use. A significantly preferred refractory adhesive is a mixture of the following components (percent composition of cured adhesive): 46.5% $SiO_2$, 45.4% $Al_2O_3$, 1.6% $Fe_2O_3$, 2% $TiO_2$, 0.2% $CaO$, 0.1% $MgO$, and 4.2% $Na_2O$ or $K_2O$ (or a combination thereof). The uncured form of this adhesive is characteristically composed of twenty to forty percent aqueous solvent. Variations in the amount of solvent varies the consistency of the adhesive composition. In general, trowel or brush type methods of application are used to facilitate the application of the thin layers of this significantly preferred refractory adhesive to the various layers of elements of the panel 10. Spray application is also feasible upon addition of solvents.

The foregoing refractory adhesives and particularly those indicated to be preferred or particularly preferred may be utilized to bond a variety of metals including aluminum and its alloys; steel and its alloys, and titanium and its alloys to the ceramic refractory plies such as 16 and 18 in paper, felt, or fabric form, as well as to bond the layers of said preferred ceramic refractory material to each other when a plurality of said layers are employed to form said refractory elements, 16 and 18.

The adhesive is preferably applied in a thickness of 0.02 inch to 0.625 inch, forming the refractory bonding plies or layers 17 between the refractory layers 16 and 18 on the one hand and the structural element 20 or elements 20 and 20a, and the plies 12 and 14 on the other hand, as shown in FIGS. 2, 3 and 4.

The preferred refractory adhesives are equally effective whether the preferred fibrous refractory ceramic plies are pliant or rigid. The plies 16 and 18 are rendered stiff or rigid by incorporation among the fibers of a solution of the same composition as that of the fibers, that is, with respect to zirconia fibers, zirconia, free of additives such as silicates and phosphates, but including, desirably, yttria and silica as characterized elsewhere herein. The rigid-inducing solution or rigidizer is applied to both sides of each of the plies 16 or 18 prior to assembly of the panel 10. Excess amounts are removed from the fibers in their assembled state by a roller, squeezer or the like.

The rigidizer is similar or identical with respect to its non-aqueous components in composition to the foregoing adhesives and fibers, but is used in a more dilute aqueous state, i.e. 3 to 6 centipoises and preferably about 4 centipoises, sufficient to permit penetration of the fibers of the paper, board, felt or the like of the refractory fibrous ply. It thus serves alike as an adhesive, differing only in consistency in order to effect the preparation of the panel or enclosure 10 in the most efficient time span. In applying the rigidizer and adhesive, in any event, and after the excess adhesive is removed, the treated ply is dried with a stream of dry air or in an oven at low temperature until the rigidizing composition becomes tacky at which point the ply is attached to the reflecting ply 12 or 14 and the structural element 15 or 15a. The laminated composite 10 is then dried further commencing at about 100° F. for 3 to 4 or more hours, increasing the temperature to 240° F. to 300° F. for a further period of 3 to 4 hours. If there are one or two refractory layers in the composite 10 the foregoing drying and partial cure is completed in 1 to 2 hours. If a number of additional layers within the scope defined hereinabove is used effective drying requires up to 24 hours. Curing is completed by heating to a temperature of 800° F. to 1000° F. for a period of one hour and up to 2000° F. desirably in accordance with the invention to impart increased strength thereto.

When cured the preferred refractory adhesives and bonded panels or plies are resistant to high and low frequency vibration as well as moisture or humidity and are stable when subject to temperatures exceeding 1850° F. and, indeed, in excess of, 2000° F. and up to 3200° F., for a period of at least two hours at ambient pressure.

When the preferred refractory silica-containing adhesive is employed, it has been discovered that gentle, uniform compression at a pressure of 1 to 10 pounds per square inch on the panel for periods from one to seven hours at 25° C. to 500° C. temperature and 10% to 50% relative humidity are normally sufficient to produce a uniform, laminated panel 10 with a cured adhesive system therein. For an illustrative two foot square panel comprising refractory elements consisting of two ⅛ inch thick sheets of said preferred ceramic refractory material, and in which the reflective and structural elements are 24 and 14 or 18 gauge steel, respectively, two hours of curing time are adequate. Adhesives, other than the foregoing inorganic metal oxide refractory adhesives can be employed in the practice of the invention; but have severely limited circumstances where they can be employed, and are consequently, significantly less preferred. These adhesives are organic compounds and will, for example, degrade at relatively reduced temperatures thus tending to defeat the purpose and the objectives the practice of the invention is designed to achieve. Illustrative of these adhesives are nylon-epoxy, nitrile-epoxy, epoxy phenols, epoxy elastomers, polyamides, polybenzimidazoles, other condensed ring linear polymers, polyurethanes, epoxy resins and the like. These organic adhesives may, of course, be used more readily with the interior plies as, for example, those used for bonding the structural element, where they will be protected.

When the refractory elements or plies, 16 and 18 are composed of refractory ceramic materials containing higher concentrations of $Al_2O_3$, as described elsewhere herein, use of an adhesive with an increased relative $Al_2O_3$ content and a decrease of the $SiO_2$ content according generally with the relative content thereof in the contiguous fibrous refractory ply has been found to be desirable.

The use of refractory ceramic materials with high alumina content is desirable wherein exposure, or liklihood of exposure, to temperatures up to as high as 1500° C. may occur.

Where fibrous $ZrO_2$, $HfO_2$ and $Y_2O_3$ containing ceramic compositions are used to form the refractory plies 16 and 18 a refractory adhesive composition having similar oxide content is required. Most desirable of these adhesives are those containing 80% to 90% $ZrO_2$, 5% to 10% $Y_2O_3$, 1% to 5% $SiO_2$, and 1% to 2% $Na_2O$ and/or $K_2O$ dry weight.

Use of an aqueous solvent comprising 20% to 40% of the wet or uncured weight of the adhesive is sufficient to provide an adhesive consistency ranging from that brushable or sprayable to that requiring trowel type application. The adhesive plies 17 in the panel 10 may be cured by exposure to temperatures ranging from 400° C. to 500° C. while the panel is subjected to uniform pressures ranging from one to ten pounds per square inch, for periods ranging from one to several hours, varying directly with the size of the panel 10. The panel thereby formed is capable of withstanding prolonged exposure to temperatures as high as 2200° C., although the outer reflective elements or plies may be destroyed or damaged after brief exposure to this temperature.

Illustrative adhesives, as well as ceramic fibrous products to be integrated therewith, for use in the practice of the present invention are those described in U.S. Pat. No. 3,077,412; U.S. Pat. No. 3,736,160; and U.S. Pat. No. 3,231,401 and incorporated by reference herein.

It is desirable, in accordance with the invention, to insure that the isolation of the reflective plies 12 and 14 and the structural element or elements 15 and 15a are sustained at the outer margins 22 of the panel 10 where joining of adjacent panels does not occur. While, the margins of a panel need not be further modified to provide an at least minimally operative enclosure, it is preferred where an access means to the interior of the enclosure 200 and 300 is defined, to provide a ply of ceramic fibrous refractory material 24 as a trim or molding. This molding 24 may be pliant or rigid and made to adhere to the margins of the plies by adhesive such as described hereinabove.

A plurality of panels 10 may be fused along their margins so that the radiant and reflective plies and structural elements of each panel are continuous with one another, interrupted only by the refractory adhesive used to secure their structural continuity or the use of tongue-in-groove edges for friction fitting or other means well-known to those skilled in the art. Fibrous ceramic angles 28 (FIG. 3) or strips 30 (FIG. 2) may be used as well to furnish the integration necessary. The moldings 24, angles 28 and strips 30 may also be formed of intumescent material or where they are disposed on a reflective layers they may indeed be metallic.

In an alternative and preferred embodiment intumescent materials, that is, compositions that swell in response to the application thereto of heat, are used as gasketing about cable entry means, for example, in the manner described hereinafter, and may also constitute the strips 24 and 30 and angles 28 replacing the ceramic fibrous material proposed for this purpose as shown in the embodiment of FIGS. 2, 3 and 4. It has been found useful additionally to wrap the cables in this intumescent material at and proximate to the point of entry into the enclosure 200 (or 300) of the invention illustrated in FIGS. 6 to 11.

Illustrated in the drawing of FIGS. 6, 7, 8 and 9 is a transaction processing center 200 and components thereof coming within the ambit of the invention and incorporating the composite laminate 10 described hereinabove and further elaborated upon hereafter. Also illustrated in FIGS. 10 and 11 are alternative embodiments of a transaction processing enclosure or module 300 adapted to secure instrumentation of reduced dimensions.

The larger enclosure 200 comprises a housing or enclosure constituting a stationary vertical wall, one or more access means and one or more preferably arcuately rotatable closure means. Two, an exterior and interior, closure means 224 and 225, respectively, are shown in FIGS. 6 and 7. The lateral margins of these closure means are, in the closed position, and thus occluding the access means, in registry with the rear stationary vertical wall 222. In the completely open position the closure means 224 and 225 are preferably disposed respectively outside and within the wall 222, moving in a path defining an axis substantially identical to that of the arcuate wall 222. The stationary wall or housing 222 and closure means 224 and 225, in a preferred embodiment, define semicylindrical panels as is evident, adapted in the closed state to steal the interior of the unit 200 from the exterior. The side wall 222 may assume a variety of other configurations in generally less preferred embodiments, as may the closure means.

The housing 222 and closure means 225 are, in fact, panels 10 adapted to fit the unit 200, and particularly those of the conformation shown in FIG. 4. This cylindrical or semi-cylindrical construction of the panel 10 and housing 222 and closure means or panel 225 is particularly preferred, not only for economy of space, but because it imparts the greatest reflective capacity to the outermost and innermost reflective plies 12 and 14 of a transaction processing enclosure such as disclosed in U.S. Pat. No. 4,121,523 of one of the inventors herein and the copending divisional application thereof, Ser. No. 952,782 filed Oct. 19, 1978.

The closure means may be segmented horizontally to give access selectively to different levels of the module's interior.

The laminate structure is continued into the upper module partition 274 and into the base 284. The construction is such that the individual plies of reflective and, desirably, bullet or projectile resistant outer layer 12, inner reflective ply 14 and the related refractory plies and structural components of the housing or vertical wall 222, are continuous with each other. This continuity does not ordinarily exist with respect to marginal interrelationship of the access means and housing wall 222, but a trim or molding of fibrous ceramic material or alternatively, and preferably, an intumescent composition as described hereinbelow, is provided along the margins of the access means and various cable entries in the manner described hereinafter. In the closed state the closure means 225 are in registry at their lateral borders with the closure plates 202 as shown in FIG. 7. These closure plates are also formed of the composite laminate 10 and have a trim or gasketing of ceramic fibrous refractory composition or preferably an intumescent material, as shown in FIGS. 8 and 9 and as described in greater detail hereinafter.

Where employed to house a bank transaction processing device, such as automatic paying or receiving machines, the module or transaction processing center 200 must comply with the burglary-resistant material for such machines including the use of ⅜ inch thick nickel stainless steel meeting the requirements of Regulation P or in lieu thereof the requirements of ASTM A 16770, or such equivalent materials authorized, or as may otherwise be authorized hereinafter from time to time, by the Board of Governors of the Federal Reserve System or other appropriate authority in the United States or other country where the apparatus of the invention is to be employed.

Where employed to house an automatic banking machine, e.g. the vault 230 thereof will ordinarily be disposed under the transaction face 232 as shown in FIG. 5 wherein the closure means 225 is shown to be horizontally segmented to provide upper (225a) and lower (225b) components. The upper closure means component 225a may be permitted to stay open during banking hours and closed at other times. Where access is desired for servicing of the machine or vault positioned under the automatic teller or bank machine face 232, shown schematically in FIG. 5, the lower closure means 225b is rotated to the open position alone or in conjunction with the upper closure means 225a. The closure means 224, where present, may be similarly segmented and rotated.

The border between the upper (225a) and lower closure means (225b) is conveniently unmodified so that the plies of the laminate or panel forming the two components of the closure means are continuous when the plies are simultaneously in the open or closed state.

In addition, the transaction processing center 200 will normally include turntable means, plate or platform 244, disposed for rotation within the housing and upon which the electronic data processing equipment, banking machinery or the like is mounted and to which all parts thereof access can be had through a single access means on the front of the module that is closed by the closure means 224 and 225.

It is, of course, feasible in accordance with the invention to provide a transaction processing enclosure of a size sufficient to permit entry of one or more operators or other persons or to modify an existing room to embody the features described herein.

The closure means 224 are mounted conveniently in a track 226a formed on the perimeter of the upper module partition 274 and additionally or alternatively (shown as 226b) in the perimeter of the module base 284 to enclose or provide access to the housed equipment. The closure means 225 may be similarly mounted but is preferably disposed in slidable relation using ballbearings 305 in the manner shown in FIG. 8.

As will be evident in this context, the turntable 244 is essentially flat, may have other supplemental turntables 246 and 248 independently superimposed within the housing 222 as shown in the free-standing embodiment of FIG. 7 and may be round or circular in horizontal conformation.

The turntable 244 or indeed supplemental turntables such as 246 and 248 and their surfaces may at the same time be specially modified to accommodate specialized apparatus as desired. The internally disposed closure means 225 and the sum of any horizontally segmented subdivisions thereof 225a and 225b, such as seen in FIG. 5, may terminate below the periphery of the platform 284 as shown in FIG. 6 at its lower margin and, in one embodiment, in the outer margin of the rotation plate 280 with which it is in fixed engagement at its upper end. In the significantly preferred embodiments of the present invention, where electronic data processing equipment or other sensitive apparatus is to be maintained free of radio frequency interference, in a controlled, discrete, isolated and protected environment or where a banking machine such as an automatic paying or receiving machine is enclosed within the module the inner closure means or access element 225 will extend preferably from the upper module partition 274 be means of a flange 289 to the base 284 in order to comply in the United States of America with the requirements of the Federal Reserve Board as expressed, for example, in Regulation P. A significantly preferred embodiment of the closure means 225 is shown in FIGS. 8 and 9 and described in detail hereinbelow.

The turntable 244 and the supplemental turntables 246 and 248 where present as shown, provide easy access to the rear or any other aspect of the electrical or electronic data processing apparatus present in the module for servicing or the like at the same site through the same access means used for operation of the contained apparatus or entry of persons thereinto; accomplishing a unique economy of function, utilization of space, and, most particularly, limited closure means requiring sealing to assure isolation and protection of the interior of the enclosure 200 from the outside at a level consistent with that afforded by the laminated housing 222 and the panel forming the closure means 225. Rotation of the turntable can be integrated selectively through a standard control panel (not shown) with opening of one or all segments of the secondary closure means. Ramps from the interior of the booth to the exterior for removal of the contained equipment for servicing may also be used in a significantly less preferred but operative embodiment.

All of the functions thus far described as well as securing or latching and unlatching of the booth or module are accomplished conveniently by means of conventional electrical circuitry well known to one skilled in the art or manually with conventional mechanical locking systems.

The turntable is, in any event, conveniently and independently controlled by operation of a drive motor 250 and drive shaft 252 interconnected through a standard system of bevelled gears 254; the drive shaft being mounted on the undersurface of the turntable 244 at its axis of rotation as illustrated in the free-standing module of FIG. 7. Alternatively, the rotation of the turntable may be accomplished by a variety of mechanical means obvious to those skilled in the art or by manual means. The position of the turntable may be fixed by an externally operated brake or locking mechanism (not shown) on the drive shaft 252.

A similar drive mechanism 270 is mounted atop the upper module partition 274 disposed within the supra module housing 275 in the embodiment illustrated in FIG. 6 by means, for example, of the rotatable shaft 276 which extends through said partition 274 in which it is independently rotatably mounted by means of a bearing assembly (not shown) to terminate in the axis of the circular horizontally disposed upper module or rotation plate 280 which is in fixed engagement with said shaft 276 and rotated thereby.

The inner protective closure means 225 of the module 200 is preferably in contiguous contact or registry with the periphery of the rotatable upper module plate 280, as noted hereinabove, and may be operated manually as well as electrically or mechanically. When the inner closure means 225 is divided horizontally the support and drive mechanism for the upper may be identical to that described hereinabove for 225 as a single unit. The support and drive mechanism for the closure means 225b will consist of an arcuate track on the base 284, of generally circular shape with internal drive ring (not shown) and, a drive motor (not shown). A particularly preferred modification of this embodiment is depicted in FIG. 8. Additional modes of operation will be apparent, as well, ts those skilled in the art. Of course, manual operation in conjunction with an electrical control means or as an over-ride method of operation of said closure means in event of failure of said drive mechanism is also an alternative. While described with respect to the inner closure means 225, it will be evident that the outer closure means 224 can be similarly segmented and the modes of operation enunciated hereinabove with respect to the inner secondary closure means 225 applied to the outer closure means as well. The lateral margins of the closure means 225 are registrable with the stationary wall 222 in the open state and its lower edges with the base 284 in a preferred embodiment as also described herein. The upper margins are also normally in registry with the ceiling or supra module partition 274 in a preferred embodiment. The stationary wall 222 is, in turn, secured within the outer margin of the upper or supra module partition 274 exterior to the outer periphery of the plate 280 and is, in a significantly preferred embodiment, continuous therewith and with the floor or base 284 upon which the unit or module is located as described hereinabove so that each ply of each panel is continuous about the periphery of the stationary wall 222, ceiling or the upper module partition 274 and base 284 except where interrupted by cable entry means, a rotatable shaft 276 and access means 225, and the like.

In a further and particularly preferred embodiment shown in FIG. 8 the access means is secured by the closure means 225 in a manner which assures sustained protection of the transaction processing enclosure by preventing penetration of the enclosure 200 by, for example, heat, cold, fire, smoke, water or moisture about the periphery of the closure means 225.

There is provided in this modification a protective system in the seams about the closure means equivalent in effectiveness to, or approaching, that provided by the laminate enclosure of the vertical housing 222 and panel of the closure means 225, the supra module housing 274 and the base 284.

For this purpose, there is provided flanges 290 and 291, respectively, extending from the ceiling 274 and the base 284 and occurring in spaced parallel alignment to the upper and lower margins 294 and 295 respectively of the closure means 225. The flanges 290 and 291 are integral with the ceiling 274 and base 284 respectively of the enclosure 200, include the outer reflective ply 12, including the support angle clips 15a, the refractory layer 16, structural ply 15 and the adhesive layers or plies (not shown) disposed between the foregoing plies. The angle clips 15a represent a further modification within the contemplation of the invention in that these clips are supplementary and optional structural metal support elements and are separated preferably from the reflective ply 12 by a refractory adhesive such as described elsewhere herein. These clips 15a are necessarily separated from the primary support elements 15 by a refractory ply or element 16 in accordance with the invention.

The upper and lower edges of the closure means 225 terminate in the ribs 297 and 298 extending perpendicularly in relation to the closure means 225 and the flanges 290 and 291. Each of the ribs 297 and 298 terminates in a self-lubricating or reduced friction seal or washer member 295 that impinges upon the interior surface of the foregoing flanges 290 and 291 and permits substantially free movement of the closure means relative thereto. This sealing member is desirably formed of a normally resilient flexible poly (tetrafluoroethylene) sold by DuPont Corporation under the trade name TEFLON, rubber, silicone rubber, ABS butadienestyrene, or like material well-known to those skilled in the art and particularly preferred are those materials having a melting point normally of at least 250° F. and up to preferably of about 450° F. Mounted upon the outer surface of the upper lower margins of the closure means adjacent but inwardly of the ribs 297 and 298 are the intumescent lips or elements 300 and 301, respectively. In space relation thereto on the interior surfaces of the flanges 290 and 291 are the complementary intumescent lips or elements 302 and 303, respectively. In a further embodiment (not shown) the sealing member 295 may be incorporated in one of the lips of the intumescent gasketing means e.g. 300 or 302, and formed conveniently by dual extrusion techniques well-known to those skilled in the art.

In the embodiment of the invention shown in FIG. 8 the slideable rotation of the closure means 225 is accomplished by means of ball bearings 305 disposed in the track 307 formed in the structural element 15 of the housing base 284. It will be evident that other means well-known to those skilled in the art for slidable opening and closing of the closure means may also be employed. These methods which may include rollers, slideways, and the like, involve a maintenance of contiguous relation between the housing and closure means in the act of opening and closing of the latter means as well as when it is at rest and are embraced herein by the terms "sliding", "slideable" and grammatical variations thereof. It will be evident, as well, that the enclosure means shown to operate horizontally may be modified to operate vertically or at an angle therefrom; with the associated sealing ring, washer or the like flange and like construction rearranged to a vertical or other disposition identical to that of the closure means 225. Illustratively, the closure means 225 may be reduced in sixe and be surrounded by the stationary vertical housing 222; rather than abutting the ceiling 274 and base 284 of the enclosure. In addition to the closure means of reduced size may be mounted in a removable panel forming a portion of the stationary vertical side wall or housing 222. In this embodiment the panel of the closure means maya be of guillotine construction such as described in U.S. Pat. No. 4,121,523 and copending application Ser. No. 952,782 filed Nov. 19, 1978 by one of the inventors herein and incorporated by reference herein. The closure means is operated electrically, mechanically, electromechanically or manually, for example.

The lateral stop elements 202a of the housing 222 referred to in context with FIG. 7 hereinabove are shown in further detail in FIGS. 9a and 9b in relation to the closure means flanges 310. The stop element closure means flanges 310 as shown illustrative in FIG. 9, complement on the lateral or vertical borders of the closure means 225 depicted in FIGS. 6, 7 and 8, the protective system of the contiguous slideable margins or borders of the closure means 225 described with particular reference to FIG. 8 hereinabove. The closure means 225 is shown in a nearby closed position in FIG. 9, with the housing stop elements 202a and 202b including the intumescent elements 310 and 311 respectively adapted to impinge upon the intumescent elements 312 and 313 abutting the closure means flanges 315a and 315b respectively. It will be evident that in the closed position portrayed in FIG. 9, the foregoing elements play the same role essentially in the event of exposure to fire or elevated temperatures as that played by the protective system disposed about the upper and lower slideable margins of the closure means 225 described with particular reference to FIG. 8 hereinabove.

The laminar construction of the closure means 225 and the adjacent housing wall 222 is again illustrated in FIG. 9. Thus, as represented, there is in each instance an outer reflective ply 12, and intermediate ceramic fibrous refractory ply 16 and an inner protected structural element 15. Ceramic adhesive plies (not shown) are also present in each instance. The terminal borders 320 of the housing 222 defining the lateral borders of the access means comprise ceramic fibrous refractory or intumescent strips 24 adapted to provide a protective trim to the exposed borders 320 of the housing 222. It will be noted that the closure means flange 315a which is positioned exterior to the stop element 202a and includes the intumescent element 310 also has an additional intumescent element 324 exterior to the seal (295) bearing flange 315a that will intumesce to occlude the passage between the housing wall 222 and closure means 225 to serve an effect similar to that of the elements 311 and 313 of FIG. 9 and 300 and 302 and 301 and 303 of FIG. 8. As described hereinabove the intumescent elements 310 and 312 will serve to provide the necessary protection to the enclosure's (200) interior in any event. The lateral margins of all of the foregoing paired intumescent elements, and the unpaired elements 324, of FIGS. 8 and 9 are free to permit free swelling into and occlusion of the passages into which they extend without occlusion at normal ambient temperatures.

The housing 222 and closure means 225 of FIGS. 9a and 9b also manifest the unique laminar structure of the invention including an outer reflective layer 12, intermediate ceramic fibrous refractory ply 16 and structural ply 15 with interposed plies of ceramic refractory adhesive (not shown). In order, however, to avoid the distribution of heat along the conductive surface of the structural element 15 from the exterior of the enclosure 200 adjacent the terminal ends 320 of the housing about the access means and the stop elements 202a and 202b in FIGS. 9a and 9b respectively into the interior of the enclosure the structural element 15 is interrupted in each instance by the ceramic fibrous refractory heat stop component 380. A similar laminar construction and like elements 380 appear in the structural elements 15 of the housing flanges 290 and 291 and adjacent the closure means flanges 297 and 298, respectively.

It is noted that while the intumescent components are said to stand free at their lateral borders it will be evident that they abut support surfaces in each instance of their use as illustrated in FIGS. 8, 9a and 9b and it is indeed preferred that they be bonded thereto for most purposes consistent with this invention using a ceramic refractory adhesive such as described elsewhere herein for this purpose.

The seal 295 assures protection of the module interior at temperatures of up to 450° F. or such other elevated temperature at which the seal normally degrades. The intumescent elements 300 and 302, 301 and 303, and 310 and 312, 311 and 313 and 324 are adapted to expand and impinge upon one another occluding the passage therebetween at a temperature below that at which the seal degrades, thus protecting the seal, but even if the temperature attained at the seal is sufficient to detroy it, the abutting intumescent elements inhibit the temperature increase, as well as the passage of noxious pollutants such as smoke, and continue the protection and stable predetermined environment of the contained equipment.

A preferred intumescent composition in accordance with the invention is vulcanized rubber, and particularly one containing ceramic refractory components, that expands commencing at about 250° F., with the foregoing intumescent elements coming into contact where paired with complete occlusion of the intervening space at about 350° F.

The forgoing arrangement for sealing the margins of the access means along the path of mvement of the closure means between an open and closed position while permitting free and flud movement thereof in normal practice and in the absence of untoward circumstances as described in context with FIG. 8 hereinabove can be repeated with the outer closure means 224 as well. An outer closure means 224 is, in fact, shown by way of illustration in FIGS. 9a and 9b.

Particularly preferred of the intumescent materials for use herein are the vulcanized rubbers and ceramic composites having a density of 96 lbs./cu. ft; and compression set (ASTM D-395B) of 25% maximum; a Shore A hardness of 45-75 and a limited oxygen index (ASTM D 2863-74) of 65%; illustrative of which is 3M FS-195 sheets manufactured by the Minnesota Mining and Manufacturing Company, St. Paul Minn.

The intumescent elements, as indicated hereinabove, unconfined about their lateral margins and employing the preferred intumescent vulcanized rubber and ceramic particulate composite, referred to above, will manifest a multidimensional expansion of 5 to 11 times, sufficient to provide, as also indicated, a nexus of the paired elements at about 350° F. (175° C.). Since, as indicated expansion occurs at as little as 250° F. (120° C.) the space between the paired elements and the element 324 and the interior housing surface at each of the margins of the closure means, the initial multidimensional thickness of ambient room temperature e.g. 22° C., and other conditions may be varied substantially. The expanded and mutually impinging elements 300 and 302 for example will, using the preferred vulcanized rubber described hereinabove, act an an effective refractory material at temperatures up to 1740° F. (950° C.) with a strength at expansion of up to 500 psi.

The elements will have a weight loss of 25 percent and a maximum reduction in density of 10 lbs/cu. ft. Normally, the expanded density will not be so reduced because it is intended in accordance with the invention that the expanded elements exert pressure on each other to eliminate any possible passage therebetween for air, smoke, fire or heat. In this latter regard the preferred intumescent material will demonstrate a thermal conductivity in Btu/hr. ft $^2$ ° F. of 0.33 at 70° F.; 0.51 at 613° F. and 0.66 at 1130° F., more than sufficient to protect any contained banking equipment and electronic data processing equipment in the transaction processing enclosure 200.

Further illustrative of incumescent sealants for use herein and which intumesce at high temperatures are those compounded of elastomers with 4 percent to 30 percent by weight vermiculite as blowing agents such as described by Hons-Oliver et al in Federal Republic of Germany Offlenlegunschrift No. 2,729,838 incorporated by reference herein. A more specific illustration of these compounds is one containing, in parts by weight, 100 parts of neoprene rubber, 11 parts of conventional vulcanizing agents, 2 parts antioxidant, 40 parts $Al_2O_3$, 10 parts chlorinated paraffin, 5 parts $SbO_3$, 8 parts decabromobiphenyl, 40 parts kaolin, 40 parts vermiculite, and 15 grams of isodecyl diphenyl phosphite as vitrifying agent. The composition is vulcanized at 160° C. Other conventional intumescent materials may also be used so long as they intumesce and occlude the passages described herein below that temperature at which the self-lubricating or low friction sealing ring melts or is otherwise degraded or destroyed.

It is noted that when the intumescent elements 300, 301, 302, 303, 311, 312, 313 and 324 are in their fully expanded state, the closure means will be immovable. It is necessary therefore that the closure means be closed at the onset of any fire or any condition giving rise to an elevated temperature outside the module 200; as well as at the inception of any acts of vandalism or other adverse circumstances. For this reason, in accordance further with the practice of the invention, the closure means 225 (and 224 where present) may be rendered responsive and activated to a closed position by an alarm, thermostat, smoke detector or the like employing conventional circuitry, responding to fire, elevated temperatures, smoke seismic shock from physical attack or unauthorized or unprogrammed attempts to gain access to the interior of the processing unit 200, or be closed and opened only when operational or service access is required for the equipment housed therein.

With continued reference to the transaction processing module or enclosure 200, and more particularly, with reference to the free-standing manifestation or embodiment of FIGS. 5 through 9 it will be seen that the upper or supra module housing or ceiling 274 defines entry into a hung ceiling 286, which contains, as shown diagrammatically in FIGS. 5 and 6, the conventional heat, ventilation and air-conditioning systems as well as electrical and communication lines into which the module may be grafted to provide, encapsulated by the module, for example, the controlled environment necessary to the enclosure's operation. The riser duct 290 serves to effect transmission of the foregoing environmental components to the interior of the module 200 in the embodiment of FIGS. 5 and 6. The upper module partition 274 is perforated as shown in FIG. 10 for the purpose of transmitting the flow of gaseous components, normally air of controlled temperature and humidity through the enclosure 200 in one embodiment of the invention. The module plate 280 is also perforated desirably to assure even and rapid distribution of the foregoing gaseous components throughout the unit 200. Ducts (not shown) are also readily provided provided in alternative embodiments for distributing air, heat, ventilation, and air-conditioning through the base 284 of the enclosure 200 with perforation thereof and the plate 244. It is also consistent with the foregoing description that individual units suitable for securing the necessary atmospheric control be placed within the supra module housing or adjacent to the enclosure 274 for delivery to the module interior or chamber wherein the apparatus 230 is located.

Where, as is normally the case the modular components are perforated as shown in FIG. 10 for the transmission of gaseous components, the opening 349 may be protected by dampers 351 constructed of the laminate 10. The dampers are advantageously mounted in proximity to the openings 349 and activated in response to the detection of a fire, elevated temperatures or other adverse conditions as characterized elsewhere herein to occlude the opening 349. Illustratively, the damper 350 is mounted on slide channels 351 and driven, by a power train consisting of a gear racks (not shown) affixed to a damper gear (not shown), which is conveniently meshed in one embodiment to a pinion gear 353 which is rotated by a drive shaft 354 and motor 355.

The damper 351 may be fitted with an outer intumescent gasket layer 356 and compliant bearing seal 357 to provide an fluid together and refractory seal while permitting an adequate operating tolerance for the damper 350 in each instance of its occurrence as it is moved slideably on the undersurface of the supra module partition on ceiling 274.

Means of fire detection 294, fire suppression 295, and motor control unit 297 and a source of emergency power 299 for these systems are placed in the supra modular housing as shown diagrammatically in FIG. 6 without effecting materially the ease of assembly, disassembly or mobility of the module 200. Alternatively, these elements may be located below the turntable 244 on the base 284 of the module 200.

A particular advantage of the transaction processing center 200 of the invention is that the entire environment of a room in which the units are disposed need not be subjected to the vigorous controlled conditions and energy deplenishing requirements of the transaction processing centers where electronic data processing equipment is housed. Ingress to and egress from any room in which a computer, for example, is housed, can take place freely and yet each module is also protected against vandalism. Each exterior closure means 224, which may be transparent where present, and interior closure means 225, is subject to latching in a conventional manner well-known to those skilled in the art to which this invention pertains. At the same time any desired piece of electronic data processing equipment can be readily removed from one location with its module and installed immediately elsewhere by "plugging" of the enclosure into existing heat, ventilation and air-conditioning lines. When an enclosure 200 is equipped with its own heating, ventilating and air-conditioning system, it may simply be connected to a conventional electrical source. Due to current United States energy conservation rules, wherein office environments must be maintained at significantly elevated or reduced temperatures in each season, use of the module 200 permits the observance of these governmental regulations while providing the appropriate environment for the contained equipment.

An extensible ramp may also be employed for installation and removal of any data or transaction processing equipment from a module or booth where the turntable upon which the equipment is placed is above the level of the floor.

There is shown in FIGS. 11 and 12 of the drawing a protective housing 400 for use with more diminutive banking and electronic data processing apparatus than that contemplated hereinabove. Illustrative of this equipment is a tabletop computer terminal or microcomputer 404 indicated diagrammatically in the foregoing FIG. 11 and 12. The transaction processing unit 400 is composed of several, or preferably a single, panel 10 forming a stationary wall 405 comprising in a preferred embodiment, an outer radiant, reflective ply 12 such as described elsewhere herein, a fibrous ceramic refractory ply 16, and the interiorly disposed structural ply 15 with intervening ceramic adhesive plies 17 such as described in FIG. 1; the several plies and resulting panel assuming a spherical conformation. Successive laminae of refractive fibrous ceramic material 16 and 18, and radiant reflective plies 12 and 14 may also be included in a further and preferred embodiments utilizing the panel, of FIG. 2 or FIG. 4, by way of illustration. A plurality of closure mans may occupy the means of access to the interior of the enclosure 400, such as described with respect to the enclosure 200. The inner closure means 406 shown in FIG. 11 in the closed state and in FIG. 12 in the open state is again formed of the curved composite laminate such as the panel 10 of FIGS. 1, 2, 3 or 4, for example, curved to adapt to the configuration of the unit 400 and mounted about a common vertical axis with that of the stationary wall or housing 405.

The rotatable closure means 406 is slideably movable about the foregoing axis and is mounted for this movement with a self-lubricating seal such as that (295) depicted hereinabove with reference to the closure means of FIGS. 8 and 9 and intumescent elements (not shown) as well to provide a system impervious to passage of both solid, and especially particulate and fluid materials about the upper and lower margins of the closure means 406 as described with respect to the free-standing transaction processing enclosure 200 described hereinabove. The lateral borders are protected by a closure plate (not shown) of the type 202 of FIG. 6, and the system described with respect thereto in FIG. 9 hereinabove.

Similarly, the housed equipment may be, and is desirably, mounted on a turntable 410. In some applications, due to the extensive variations in size of such diminutive equipment, an extensible platform or the like in association with a service access panel formed in the housing may be employed in lieu of a turntable to provide the necessary access for servicing of the equipment housed within the unit 400. In like manner, as observed hereinabove, certain of the embodiments of the larger enclosure 200, may omit use of the turntable where the housed equipment requires infrequent service or operator access or is otherwise poorly adapted to rotation as where a great number of non-compliant cables penetrate the enclosure from a variety of aspects. The lateral margins of the closure means are provided with intumescent gaskets as are the top and base margins in the manner described hereinabove with respect to the larger enclosure 200. Means of ventilation, such as a blower assembly, air-conditioning, humidity and temperature control equipment, detection and a fire detection element and the like are conveniently incorporated within the enclosure 400 or its base 420 with suitable duct systems where necessary or desirable and provided in the manner described with respect to the embodiment of FIGS. 5 to 7; using activating means desirably to move the closure means to a closed position in response to a threatening and adverse external environment.

The inner closure means 406 may be mounted so as to revolve about a horizontal or intermediate axis between the horizontal and vertical planes, as well. The general shape of the enclosure is shown to be spherical in the preferred embodiment of FIG. 9 and 10. It is appreciated, in any event, that a variety of shapes can be utilized in defining the configuration of the enclosure 400 and that the configuration of the stationary wall 405, e.g. spherical, and the closure means 407, e.g. hemispherical or arcuate, will depend in large measure on the space of the computer terminal or micro-computer 404 enclosed. The closure means 406 may otherwise be moved manually or by means of a drive element containing a slip clutch to stop arcuate motion of the inner closure means or shield 406, when its path is obstructed. Advantageously, the enclosure 400 may be mounted on a counter or desk top or on a supporting surface capable of being adjusted to any desired height.

Cable and duct entries (not shown) may be provided not only in the ceiling 274 of the transaction processing center 200 or the top of the smaller unit 400 and in the basis 284 and 320 of the larger (200) and small (400) units, respectively, as noted hereinabove, but in the sidewalls thereof in both instances. These cable and duct entries, providing for environmental protection, control and the like as characterized elsewhere herein are desirably enveloped by intumescent gaskets wherein the intumescent refractory material is such as described hereinabove.

A significant advantage in the use of the composite panels 10 of the invention to house electrical equipment is the isolation from one another of the internal and external conductive surfaces which may be independently grounded eliminating the transmission of abnormal electrical current from the internal surface to the exterior of the enclosure; avoiding the possibility of accidentally exposing a passer-by to electrical injury.

In addition the metal components within the composite panel have a constant resistance, dependent on the size and composition of the individual plies of the laminate. Continuous or periodic movement of the resistance across the laminate of housing or closure means reveals and measures penetration of the panel structure due to alteration of the resistance constant. This feature permits ready detection of attempts to gain forceful entry into the enclosures 200 and 400 which can be readily reported electrically by way of illustration, to a remote monitoring source.

The enclosures of the present invention have application to storage and containment of conventional paper files, currency, microfilm, jewelry and other valuables as well as unique utility in preservation of magnetic tapes, disk packs, microprocessor chips, characterized herein for convenience as "peripheral electronic data processing equipment". The invention has application as well to automatic tellers' units and dispensing equipment dealing, for example, in currency, tickets and other valuables, referred to herein as "banking equipment", and as noted elsewhere herein, has particular utility as well for containment of communications apparatus, technical precision scientific equipment, hydrogen lasers, and conventional "electronic data processing equipment", which term is intended to include computer main frames, terminals and other standard peripheral devices.

The following examples are further illustrative of the invention.

EXAMPLE I (a) A composite panel for use in a transaction processing center and constructed in accordance with FIG. 4 having an outer radiant reflective lamina 12 and in inner radiant reflective ply 14 and ceramic fibrous plies 16 and 18 disposed on the interior of each of said radiant reflective plies and a structural ply 15 disposed therebetween was tested to determine its heat transfer characteristics. The radiant reflective metal plies were formed of 22 gauge stainless steel type 410; the structural ply was 16 gauge cold rolled steel; the fibrous ceramic refractory plies were composed of four layers of ceramic fibrous paper of 0.125 inch thickness; and all of the foregoing plies were bonded to one another by plies of ceramic refractory adhesive. The fibrous plies have the following composition:

| Component | % by weight |
|---|---|
| $Al_2O_3$ | 51.7 |
| $SiO_2$ | 47.6 |
| $Na_2O$ | 0.3 |
| $B_2O_3$ | 0.15 |
| $Fe_2O_3$ | 0.02 |
| Trace Inorganics | 0.2 |

The fibers of the ceramic refractory paper are up to 1 inch in length and have a mean average diameter thickness of 2 to 3 microns. The melting point of this paper is 3260° F. The paper is made from washed fibers from which the unfiberized shot is removed by washing. The washed wet fibers are then formed into a flexible, light weight paper or sheet by a Foudrinier processing machine.

The ceramic refractory adhesive plies interposed between and bonding the the foregoing radiant reflective, refractory and structural plies to one another have a total thickness of from 1.00 to 1.25 inch. The adhesive employed has a chemical composition as follows:

| Component | % by weight |
|---|---|
| $Al_2O_3$ | 44 |
| $SiO_2$ | 54 |
| $Na_2O$ | 0.8 |
| $B_2O_2$ | 0.6 |
| MgO | 0.4 |
| $Fe_2O_3$ | 0.04 |
| Trace Inorganics | 0.2 |

The adhesive was applied as an aqueous paste in an approximate thickness of 0.060 inch on each side of each refractory ply; providing, an additional ply to the panels in each instance. The panel is 3.6 feet square, as constructed, and is placed upon an open hearth furnace such that the outer reflective lamina 12 is directly exposed to oven heat and flames, which impinge upon its surface. The surface temperature is recorded 1 inch and 2 inches from the opposite reflective ply 14 and is measured in accordance with Underwriters Laboratories Standard 72 for the fire protection of tape and disk storage media. The panel is then subject to exposure to the time-temperature curve required by this standard. At the end of 271 minutes the unexposed surface temperature as measured does not exceed 150° F.

A comparable structural construction requires use of a concrete wall in excess of 6 inches in thickness.

It should be understood that the embodiments just described merely illustrate principles of the invention. Many modifications may, of course, be made to this particular embodiment without departure from the spirit and scope of the invention as set forth in the following claims.

What is claimed is:

1. A transaction processing enclosure, suitable for housing electronic data processing equipment, documentation, banking pay-out and receiving apparatus and the like, that comprises a heat-resistant housing; access means in said housing to the interior of said enclosure; said enclosure means having outer surface conforming in size and shape, and registrable, with said access means to effect the opening and closing thereof; said housing including guide means disposed along opposed borders of said closure means for accommodating movement thereof between an open and closed position and a sealing arrangement comprising a flange parallel and adjacent to each of said guide means; fluid-tight sealing means of reduced friction disposed between each of said flanges and said closure means; and a strip of intumescent composition mounted upon opposed margins of said closure means and said flanges in spaced parallel relation to each other and adjacent said guide means; said intumscent strips being adapted to expand into contiguous relation to each other at elevated temperatures below the melting or distintegration temperature of said seals and to itself resist deterioration at elevated temperatures at least more nearly approaching that of said housing and closure means to that said enclosure including each of said housing, closure means, and sealing arrangement render said complete enclosure fire and heat resistant under a comparable range of environmental conditions.

* * * * *